(12) United States Patent
Oman

(10) Patent No.: US 7,564,128 B2
(45) Date of Patent: Jul. 21, 2009

(54) FULLY TESTABLE SURFACE MOUNT DIE PACKAGE CONFIGURED FOR TWO-SIDED COOLING

(75) Inventor: Todd P. Oman, Greentown, IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 11/983,247

(22) Filed: Nov. 8, 2007

(65) Prior Publication Data
US 2009/0121340 A1 May 14, 2009

(51) Int. Cl.
*H01L 23/34* (2006.01)

(52) U.S. Cl. ............. 257/713; 257/725; 257/E23.101

(58) Field of Classification Search ............. 174/524; 361/706, 792; 257/777, 778, E23.101, E23.106, 257/E25.018, 712
See application file for complete search history.

(56) References Cited

U.S. PATENT DOCUMENTS 6,180,881 B1 * 1/2001 Isaak .................. 174/524
6,873,043 B2    9/2004 Oman
7,030,317 B1    4/2006 Oman

* cited by examiner

*Primary Examiner*—Evan Pert
*Assistant Examiner*—Shweta Mulcare
(74) *Attorney, Agent, or Firm*—Jimmy L. Funke

(57) ABSTRACT

A power semiconductor die is sandwiched between upper and lower heat conducting laminate structures to form a surface mount component that is configured for double-sided cooling. The upper heat conducting laminate structure electrically couples top-side die terminal(s) to conductors formed on the inboard face of the lower heat conducting laminate structure, and all of the die terminals are electrically coupled to conductors formed on the outboard face of the lower heat conducting laminate structure. The die package can be placed in a test fixture for full power testing, and when installed in an electronic assembly including a circuit board and upper and lower heatsinks, the die is thermally coupled to the upper heatsink through the upper heat conducting laminate structure, and to the lower heatsink through the circuit board and the lower heat conducting laminate structure.

4 Claims, 2 Drawing Sheets

FULLY TESTABLE SURFACE MOUNT DIE PACKAGE CONFIGURED FOR TWO-SIDED COOLING

TECHNICAL FIELD

The present invention relates to a surface mount electronic component including a power semiconductor die that is testable at full power and configured for both top-side and bottom-side cooling.

BACKGROUND OF THE INVENTION

High power transistor and diode semiconductor die configured for direct mounting on a substrate typically include terminal pads on both major faces. For example, a power field effect transistor (FET) has its source and gate terminals formed on one face, and its drain terminal formed on the opposite face. The terminals on one face of the die interface directly with conductors formed on the surface of a substrate on which the die is mounted, and the terminal(s) on the exposed face of the die can be coupled to other substrate conductors by wire bonding. However, the wire bonds interfere with top-side cooling of the die, effectively limiting the power dissipation of the device. The U.S. Pat. No. 6,873,043 discloses an improved arrangement in which a heat conducting laminate structure couples terminal(s) on the exposed face of the die to substrate conductors and at the same time thermally couples the die to a top-side heatsink for improved heat dissipation.

SUMMARY OF THE INVENTION

The present invention is directed to an improved packaging arrangement for a power semiconductor die in which the die is sandwiched between upper and lower heat conducting laminate structures to form a surface mount component that is configured for double-sided cooling. The upper heat conducting laminate structure electrically couples top-side die terminal(s) to conductors formed on the inboard face of the lower heat conducting laminate structure, and all of the die terminals are electrically coupled to conductors formed on the outboard face of the lower heat conducting laminate structure. As a surface mount component, the die package can be placed in a test fixture for full power testing since the upper and lower heat conducting laminate structures both protect the die and thermally couple it to the test fixture. And when the die package is installed in an electronic assembly including a substrate and upper and lower heatsinks, the die is thermally coupled to the upper heatsink through the upper heat conducting laminate structure, and to the lower heatsink through the substrate and the lower heat conducting laminate structure.

DESCRIPTION OF THE PREFERRED EMBODIMENT

Figure 1:
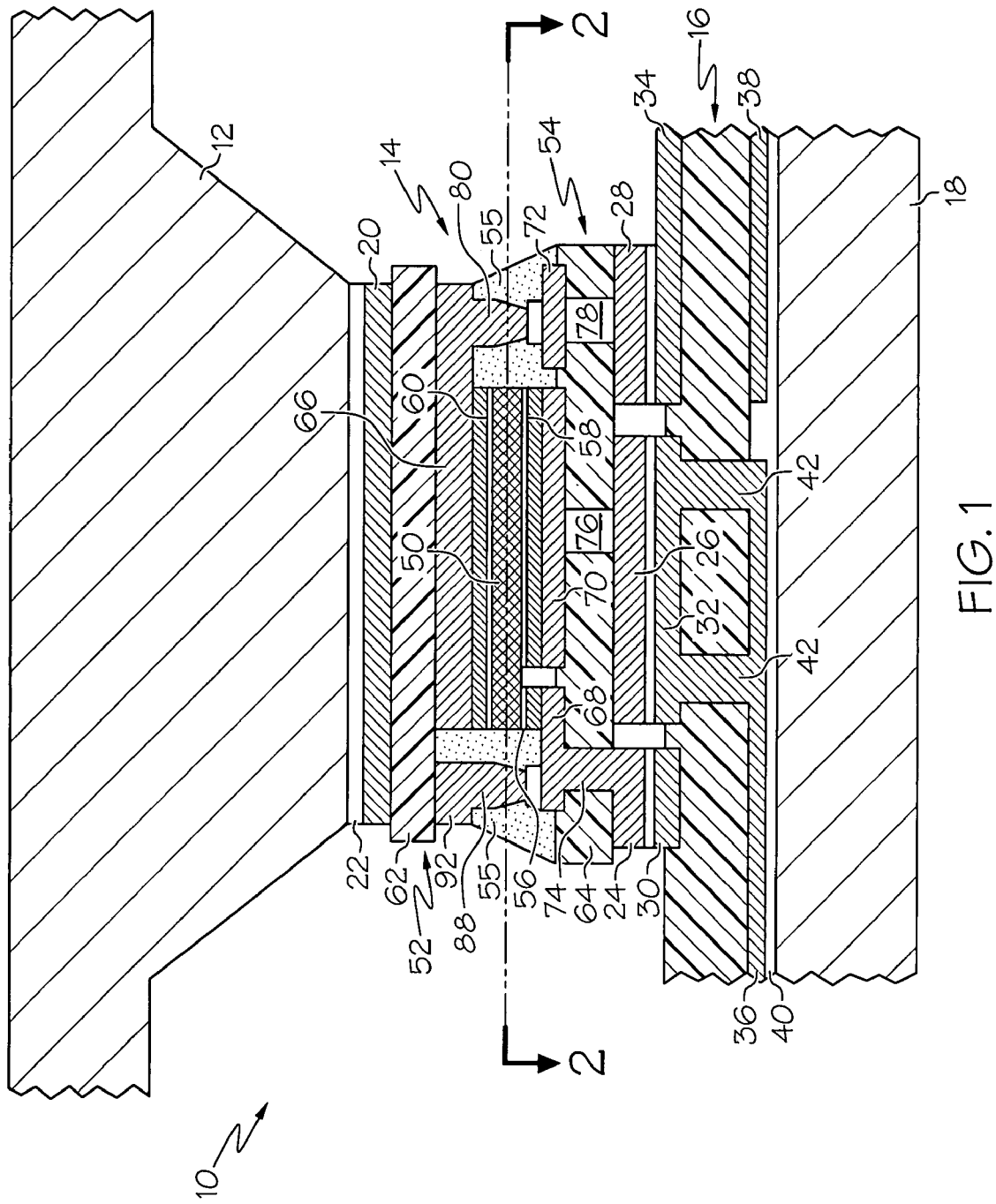
FIG. 1 is a partial cross-sectional view of an electronic assembly including a substrate, upper and lower heatsinks, and a die package according to the present invention.

Referring to the drawings, and particularly to FIG. 1, the reference numeral 10 generally designates an electronic assembly including an upper heatsink 12, a surface mount power transistor die package 14, a circuit board 16, and a lower heatsink 18. A conductor layer 20 formed on the upper face of die package 14 is thermally coupled to upper heatsink 12 with a thermal interface material 22, and set of die package terminals 24, 26, 28 formed on the lower face of die package 14 are soldered a set of conductors 30, 32, 34 formed on the upper face of circuit board 16. Conductor layers 36, 38 formed on the lower face of circuit board 16 are thermally coupled to lower heatsink 18 with a thermal interface material 40, and a set of metal-filled vias 42 thermally couple the upper conductor 32 to the lower conductor layer 36.

The die package 14 is a surface-mount component that is manufactured, tested, and then mounted on the circuit board 16 as described above. In the illustrated embodiment, the die package 14 includes a power FET die 50 sandwiched between an upper and lower heat conducting laminate structures 52 and 54, and a suitable under-fill material 55. The die package terminals 24, 26 and 28 are formed on the outboard face of lower heat conducting laminate structure 54, and are internally coupled to the gate, source and drain terminals 56, 58 and 60 of FET die 50. Since the upper and lower heat conducting laminate structures 52 and 54 are also thermally coupled to FET die 50, the die package 14 can be placed in a test fixture and tested at full power prior to its incorporation into the electronic assembly 10 of FIG. 1.

Figure 2:
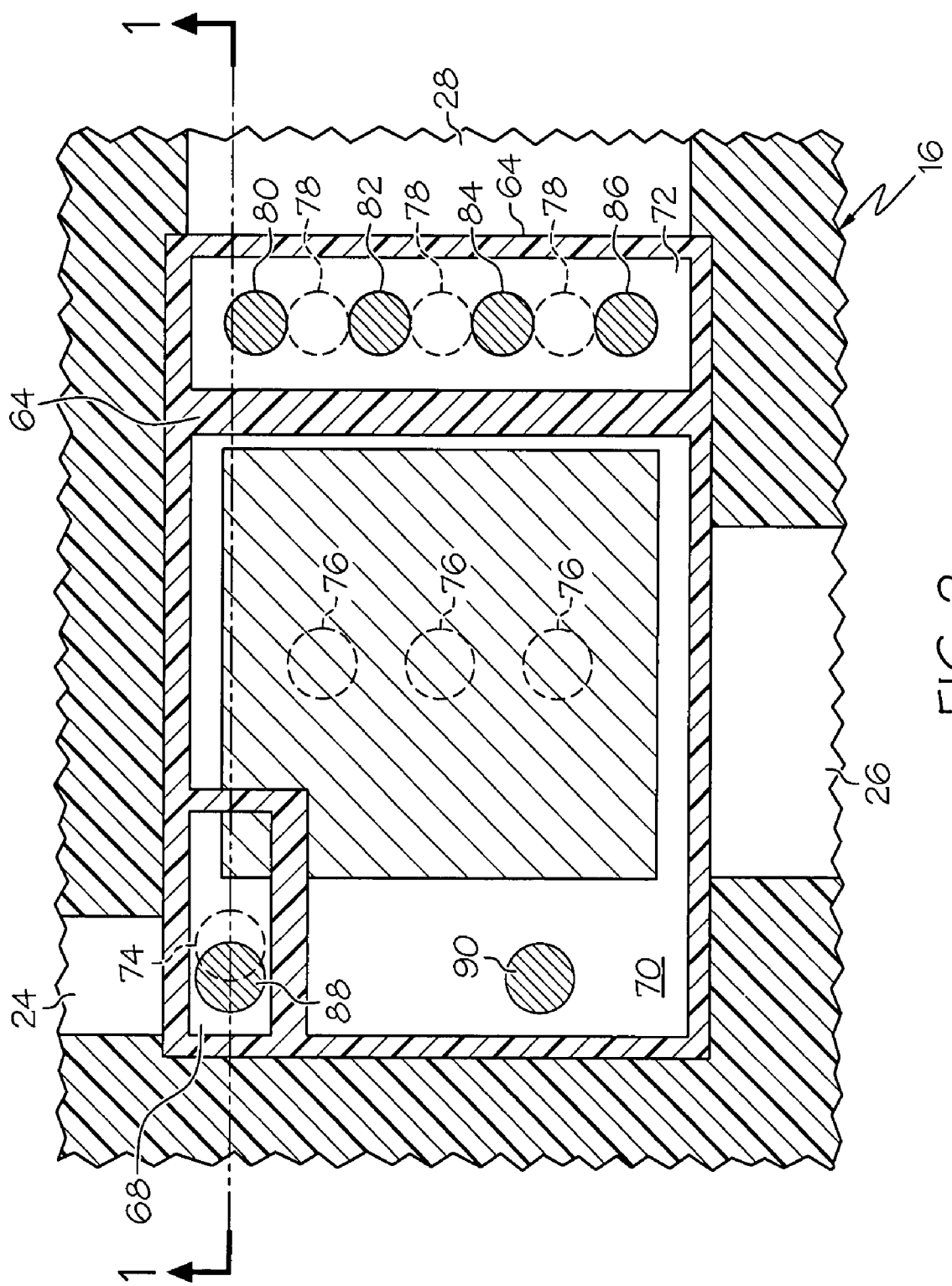
FIG. 2 is a cross-sectional view of the electronic assembly of FIG. 1 taken along lines 2-2 of FIG. 1.

Referring to FIGS. 1 and 2, upper and lower heat conducting laminate structures 52, 54 each include a heat conductive but electrically insulative substrate 62, 64 of ceramic (SiN or AlN, for example) or organic material, and sets of metal (Cu or Ag, for example) conductors bonded to their upper and lower faces. The upper heat conductive laminate structure 52 includes the conductor layer 20 formed on the upper or outboard face of substrate 62, and a drain conductor 66 formed on the lower or inboard face of substrate 62. The drain conductor 66 is soldered to the drain terminal 60 of FET die 50, and the substrate 62 electrically isolates conductor layer 20 (and therefore heatsink 12) from the FET die 50. The lower heat conductive laminate structure 54 includes the die package terminals 24, 26 and 28 formed on the lower or outboard face of substrate 64, and gate, source and drain conductors 68, 70 and 72 formed on the upper or inboard face of substrate 64. The gate conductor 68 is thermally and electrically coupled to the die package terminal 24 by a metal filled via 74 through substrate 64; the source conductor 70 is thermally and electrically coupled to the die package terminal 26 by a set of three metal filled vias 76 through substrate 64; and the drain conductor 72 is thermally and electrically coupled to the die package terminal 28 by a set of three metal filled vias 78 through substrate 64. In the electronic assembly 10, the circuit board 16 electrically isolates the die package terminals 24 and 28 (i.e., the FET gate and drain) from heatsink 18; and the metal filled vias 42 and circuit board conductors 32 and 36 thermally couple the die package terminal 26 (i.e., the FET source) to heatsink 18.

As seen in FIGS. 1-2, the upper and lower heat conducting laminate structures 52 and 54 are joined by a set of conductive standoffs 80-90 distributed about the lateral periphery of FET die 50. In the illustrated embodiment, the standoffs 80-90 are integral with conductors formed on the inboard face of the upper heat conducting laminate structure 52, and are soldered to conductors formed on the inboard face of lower heat conducting laminate structure 54, but the opposite configuration is also possible. The standoffs 80-90 may be constructed, for example, by brazing copper balls onto a copper conductor, but other techniques are also possible. Four standoffs 80, 82, 84 and 86 extend between the drain conductor 66 of upper heat conducting laminate structure 52 and the drain conductor 72 of lower heat conducting laminate structure 54, and serve (along with vias 78) to electrically couple the FET drain terminal 60 to the die package terminal 28. The remaining standoffs 88 and 90 provide mechanical support between the heat conducting laminate structures 52 and 54, but serve no electrical function. The standoff 88 extends between the gate conductor 68 of lower heat conducting laminate structure 54 and a conductor 92 formed on the inboard face of upper substrate 62. And the standoff 90 extends between the source conductor 70 of lower heat conducting laminate structure 54 and a conductor (not shown) formed on the inboard face of upper substrate 62.

The above-described die package 14 and electronic assembly 10 offer many operating advantages, the foremost of which are significantly improve heat dissipation and full power testability. While the invention has been described with respect to the illustrated embodiment, it is recognized that numerous modifications and variations in addition to those mentioned herein will occur to those skilled in the art. For example, the die 50 may be a device other than a FET, more or fewer standoffs may be used, the under-fill material 55 may be eliminated or replaced with a plastic molding compound, and so forth. Accordingly, it is intended that the invention not be limited to the disclosed embodiment, but that it have the full scope permitted by the language of the following claims.

The invention claimed is:

1. A power power semiconductor die package, comprising:
   a power semiconductor die sandwiched between first and second insulative thermally conductive substrates through which heat generated during testing and operation of the power semiconductor die is dissipated, the power semiconductor die having first and second oppositely disposed major faces and one or more terminals formed on each of said major faces;
   a set of planar surface-mount die package terminals formed on an outboard face of the second substrate to configure said power semiconductor die package as a surface-mount component; and
   a set of interconnect conductors formed on the first and second insulative thermally conductive substrates for electrically interconnecting each of the terminals of said power semiconductor die to the planar surface-mount die package terminals formed the outboard face of the second substrate so that said power semiconductor die is electrically testable at full power in said die package prior to surface-mounting said die package in an electronic assembly.

2. The power semiconductor die package of claim 1, where said set of interconnect conductors comprise:
   at least one inboard planar conductor formed on an inboard face of the first substrate;
   a set of planar inboard conductors formed on an inboard face of the second substrate;
   a conductive column disposed laterally outboard of said die and electrically coupling said at least one inboard conductor of the first substrate to one of the inboard conductors of the second substrate; and
   conductive vias in the second substrate coupling said set of planar inboard conductors to said set of planar surface-mount die package terminals.

3. The power semiconductor die package of claim 2, where:
   said conductive column is integral with said one of the inboard conductors of said second substrate.

4. The power semiconductor die package of claim 2, where:
   said conductive column is integral with said at least one inboard conductor of said first substrate.

* * * * *